US012283508B2

(12) United States Patent
Shibata et al.

(10) Patent No.: US 12,283,508 B2
(45) Date of Patent: Apr. 22, 2025

(54) IN-VACUUM TWIN-ARM ROBOT

(71) Applicant: Kawasaki Jukogyo Kabushiki Kaisha, Kobe (JP)

(72) Inventors: Takeshi Shibata, Kobe (JP); Yoshiki Maeda, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 225 days.

(21) Appl. No.: 17/917,555

(22) PCT Filed: Apr. 5, 2021

(86) PCT No.: PCT/JP2021/014558
§ 371 (c)(1),
(2) Date: Oct. 7, 2022

(87) PCT Pub. No.: WO2021/206071
PCT Pub. Date: Oct. 14, 2021

(65) Prior Publication Data
US 2023/0141856 A1 May 11, 2023

(30) Foreign Application Priority Data
Apr. 7, 2020 (JP) .................................. 2020-068915

(51) Int. Cl.
*H01L 21/677* (2006.01)
*B25J 9/04* (2006.01)
(Continued)

(52) U.S. Cl.
CPC ........ *H01L 21/67742* (2013.01); *B25J 9/043* (2013.01); *B25J 9/1682* (2013.01);
(Continued)

(58) Field of Classification Search
CPC ......... H01L 21/67742; H01L 21/67167; H01L 21/67745; H01L 21/67766;
(Continued)

(56) References Cited

U.S. PATENT DOCUMENTS 7,578,649 B2 8/2009 Caveney et al.
2003/0223853 A1* 12/2003 Caveney .................. B25J 9/042
414/744.5
(Continued)

FOREIGN PATENT DOCUMENTS

JP 11-284049 A 10/1999
JP 2008135630 A * 6/2008
JP 2014-144527 A 8/2014

*Primary Examiner* — Abby Y Lin
*Assistant Examiner* — Dylan M Katz
(74) *Attorney, Agent, or Firm* — XSENSUS LLP

(57) ABSTRACT

An in-vacuum twin-arm robot transports substrates in a vacuum space. The in-vacuum twin-arm robot includes a base arm, a first arm, a second arm, a first hand, and a second hand. The base arm can move vertically and can rotate. The first arm can rotate with respect to the base arm. The second arm can rotate with respect to the base arm. The first hand rotates with respect to the first arm and holds and transports the substrate. The second hand rotates with respect to the second arm and holds and transports the substrate. The first arm and the second arm are rotatably mounted on a leading end of the base arm via a joint shaft formed hollow. An angle of the first hand with respect to the first arm and an angle of the second hand with respect to the second arm can be changed independently of each other.

8 Claims, 7 Drawing Sheets

(51) Int. Cl.
    *B25J 9/16*         (2006.01)
    *B25J 11/00*       (2006.01)
    *B25J 19/00*       (2006.01)
    *H01L 21/67*       (2006.01)
    *H01L 21/687*     (2006.01)

(52) U.S. Cl.
    CPC ....... *B25J 11/0095* (2013.01); *B25J 19/0029* (2013.01); *H01L 21/67167* (2013.01); *H01L 21/67745* (2013.01); *H01L 21/67766* (2013.01); *H01L 21/67778* (2013.01); *H01L 21/68707* (2013.01)

(58) Field of Classification Search
    CPC ......... H01L 21/67778; H01L 21/68707; H01L 21/677; B25J 9/043; B25J 9/1682; B25J 11/0095; B25J 19/0029; B25J 15/0052; B25J 15/0095; B25J 9/042; B25J 9/06; G05B 2219/45031
    See application file for complete search history.

(56) References Cited

U.S. PATENT DOCUMENTS

| | | | |
|---|---|---|---|
| 2008/0260500 A1* | 10/2008 | Meulen | H01L 21/67742 414/217 |
| 2009/0169343 A1* | 7/2009 | Tange | H01L 21/67742 414/217 |
| 2013/0156534 A1* | 6/2013 | Furukawa | B25J 9/1065 414/744.5 |
| 2019/0054612 A1* | 2/2019 | Kremerman | B25J 9/044 |
| 2020/0075376 A1* | 3/2020 | Fukasawa | H01L 21/67745 |

\* cited by examiner

IN-VACUUM TWIN-ARM ROBOT

CROSS-REFERENCE TO RELATED APPLICATIONS

The present application is based on PCT filing PCT/JP2021/014558, filed Apr. 5, 2021, which claims priority to JP 2020-068915, filed Apr. 7, 2020, the entire contents of each of which are incorporated herein by reference.

TECHNICAL FIELD

The present invention relates to a twin-arm robot that transports wafers in a vacuum space.

BACKGROUND ART

Conventionally, a twin-arm robot for wafer transportation is known, which picks up and transports wafers from wafer storage devices, processing devices, etc. PTL 1 discloses this type of twin-arm substrate transfer apparatus.

The twin-arm substrate transfer apparatus of PTL 1 comprises a drive section, an upper arm, a first forearm, and a second forearm. One end of the upper arm is rotatably connected to the drive section. The first forearm and the second forearm are connected to the upper arm and can be rotated with respect to the upper arm.

CITATION LIST

Patent Literature

PTL 1: U.S. Pat. No. 7,578,649

SUMMARY OF THE INVENTION

Problem to Be Solved by the Invention

In the configuration of the above PTL 1, a second support shaft to which the second forearm is fixed is provided within the first hollow support shaft to which the first forearm is fixed. Therefore, when the end-effectors mounted on the first forearm and the second forearm are equipped with sensors, etc., it is difficult to place harnesses, etc. for output/input of electrical signals inside the twin-arm substrate transfer apparatus.

The present invention has been made in view of the circumstances described above, and its purpose is to provide an in-vacuum twin arm robot that can effectively utilize internal space.

Solution to the Problem and Effect

Problems to be solved by the present invention are as described above, and next, means for solving the problems and effects thereof will be described.

According to the first aspect of the present invention, an in-vacuum twin-arm robot having the following configuration is provided. That is, this in-vacuum twin-arm robot is used to transport substrates in a sealed vacuum space. The in-vacuum twin-arm robot comprises a base arm, a first arm, a second arm, a first hand, and a second hand. The base arm can move vertically and can rotate. The first arm can rotate with respect to the base arm. The second arm can rotate with respect to the base arm. The first hand can rotate with respect to the first arm, and the first hand holds and transports a substrate. The second hand can rotate with respect to the second arm, and the second hand holds and transports a substrate. The first arm and the second arm are rotatably mounted on a leading end of the base arm via a joint shaft formed hollow. An angle of the first hand with respect to the first arm and an angle of the second hand with respect to the second arm can be changed independently of each other.

This allows for efficient use of the internal space of the joint shaft. Therefore, it can realize miniaturization of the in-vacuum twin-arm robot. In addition, by the independent drive of the two hands, it can realize a variety of movements of the in-vacuum twin-arm robot.

According to the second aspect of the present invention, an in-vacuum twin-arm robot having the following configuration is provided. That is, this in-vacuum twin-arm robot is used to transport substrates in a sealed vacuum space. The in-vacuum twin-arm robot comprises a base arm, a first arm, a second arm, a first hand, and a second hand. The base arm can move vertically and can rotate. The first arm can rotate with respect to the base arm. The second arm can rotate with respect to the base arm. The first hand can rotate with respect to the first arm, and the first hand holds and transports a substrate. The second hand can rotate with respect to the second arm, and the second hand holds and transports a substrate. The first arm and the second arm are rotatably mounted on a leading end of the base arm via a joint shaft formed hollow. A length of the base arm is greater than a length of the first arm and greater than a length of the second arm.

This allows for efficient use of the internal space of the joint shaft. Therefore, it can realize miniaturization of the in-vacuum twin-arm robot. In addition, the access distance for the robot is greater, allowing it to flexibly adapt to the layout of the surrounding chamber.

Effect of the Invention

The invention provides an in-vacuum twin-arm robot that can effectively utilize internal space.

EMBODIMENT FOR CARRYING OUT THE INVENTION

Figure 1:
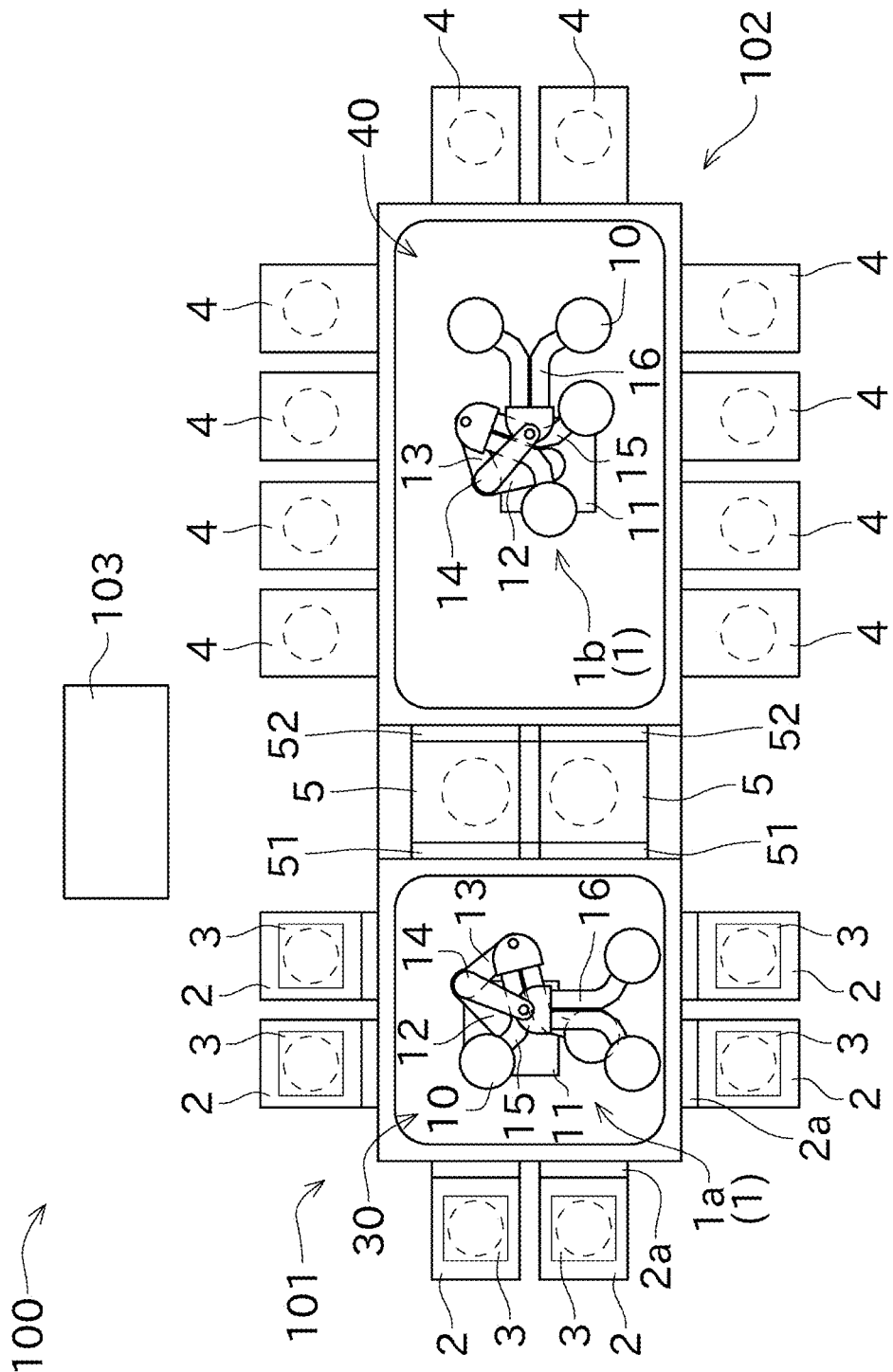
FIG. 1 is a schematic plan view showing a semiconductor processing facility equipped with an in-vacuum twin-arm robot according to one embodiment of the present invention.
Figure 2:
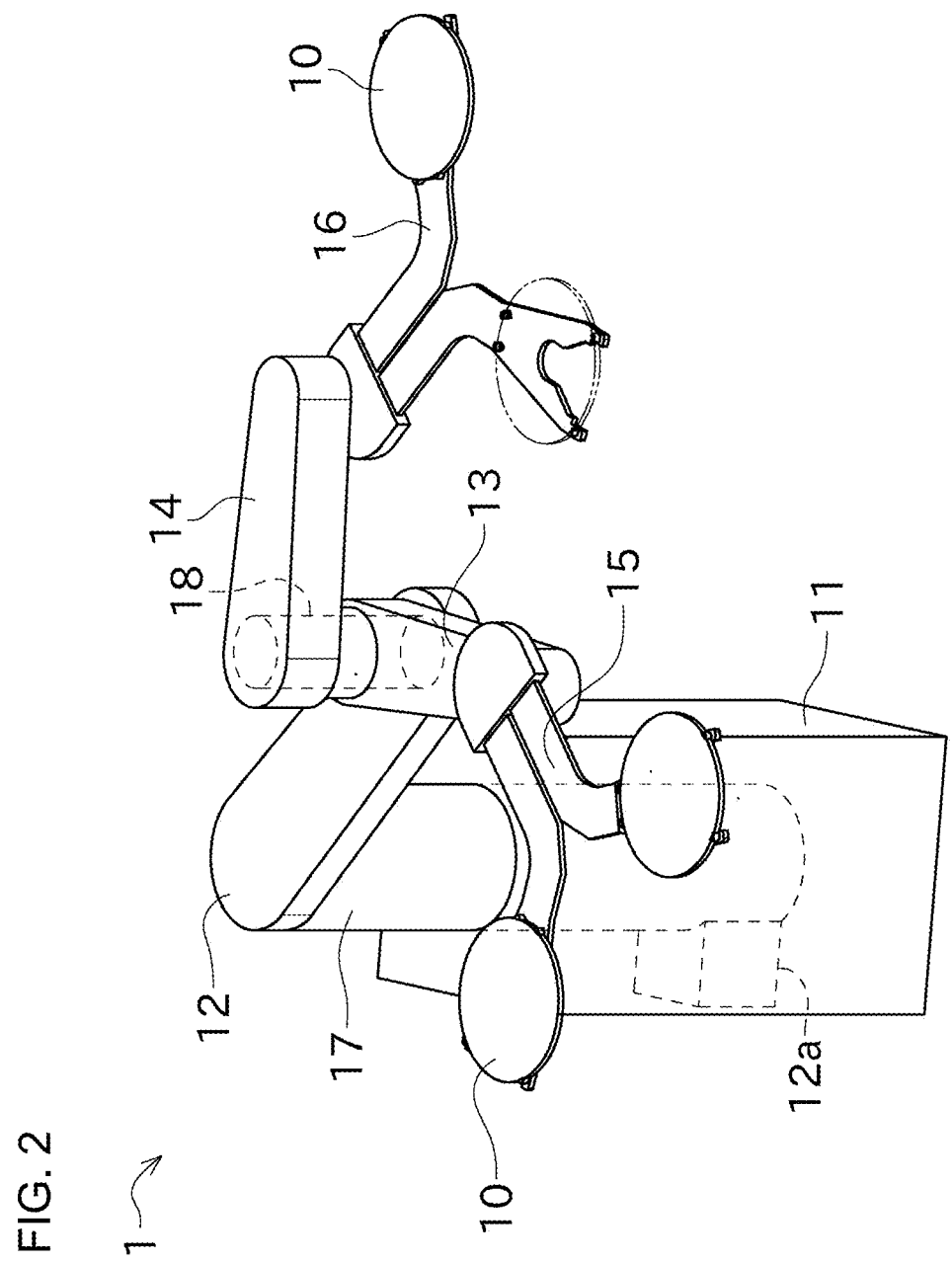
FIG. 2 is a diagonal view showing a configuration of the in-vacuum twin-arm robot.
Figure 3:
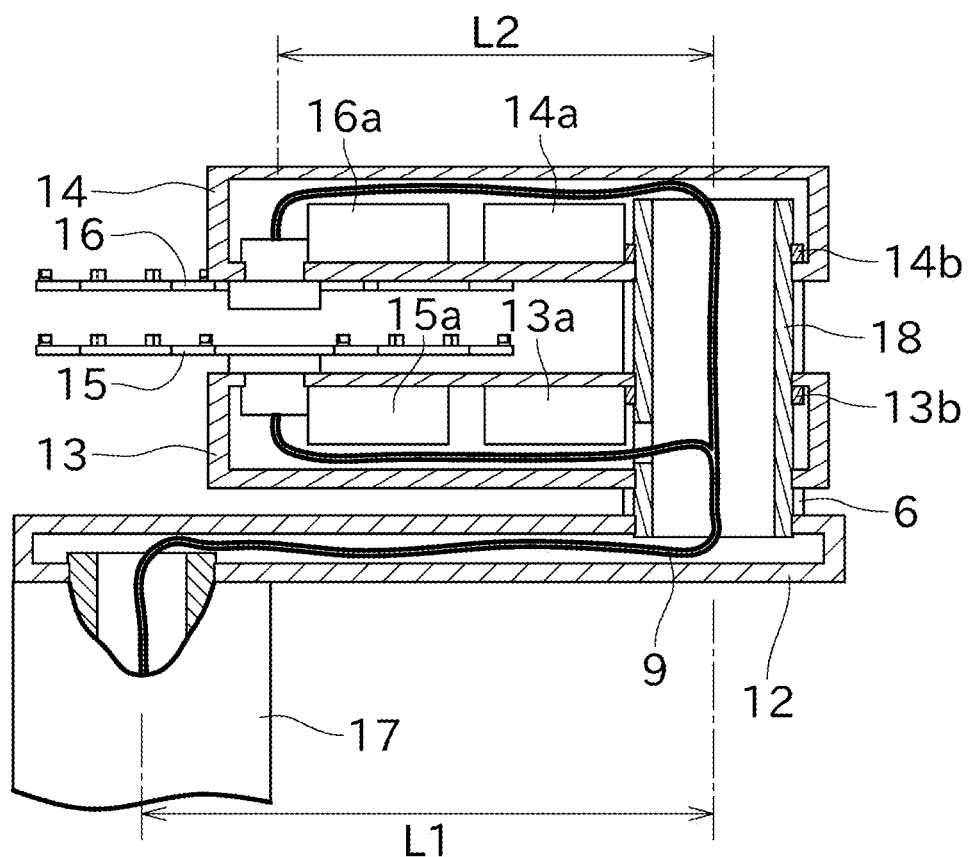
FIG. 3 is a partial cross-sectional view showing an inside of the in-vacuum twin-arm robot.

Next, an embodiment of the present invention will be described with reference to drawings. FIG. 1 is a schematic plan view showing a semiconductor processing system 100 equipped with an in-vacuum twin-arm robot 1 according to one embodiment of the present invention. FIG. 2 is a diagonal view showing a configuration of the in-vacuum twin-arm robot 1. FIG. 3 is a partial cross-sectional view showing the inside of the in-vacuum twin-arm robot 1.

The semiconductor processing system 100 shown in FIG. 1 applies various predetermined processes to a wafer 10, which is an object to be processed in the system. The wafer 10 may be any of the following: raw materials of the wafer 10, semi-finished products undergoing processing, and finished products that have been processed. The wafer 10 in this embodiment is disc-shaped, but is not limited to this.

Various process treatments applied to the wafer 10 may include, for example, cleaning, film deposition, resist coating, exposure, development, etching, impurity implantation, impurity activation, resist stripping, and others.

The semiconductor processing system 100 mainly includes a storage unit 101, a processing unit 102, and a control unit (robot controller) 103.

The storage unit 101 includes an in-vacuum twin-arm robot 1, a plurality of load ports 2, and a plurality of storage devices 3. In this embodiment, the storage unit 101 includes six load ports 2 and storage devices 3. However, this is an example, and the number of load ports 2 and storage devices 3 can be increased or decreased as necessary. In the following description, the in-vacuum twin-arm robot 1 included by the storage unit 101 may be referred to as storage-side robot 1a.

In the storage unit 101, a space sealed against the external environment is formed. The interior of the space is filled with a predetermined gas. This gas can be, for example, nitrogen gas. Because the amount of this gas filled is quite small, the interior of the storage unit 101 is in a substantial vacuum.

The storage-side robot 1a is configured as a horizontal articulated robot, for example. The storage-side robot 1a is used for transferring the wafers 10. This transfer includes carrying the wafers 10 into and out of the storage device 3. The storage-side robot 1a is arranged in a storage preparation chamber 30 formed in the storage unit 101. The specific configuration of this in-vacuum twin-arm robot 1 (storage-side robot 1a) will be described later.

The load ports 2 are provided on the outside of the walls that make up the storage preparation chamber 30. In this embodiment, the six load ports 2 are arranged to surround the storage preparation chamber 30 in three directions. Each load port 2 includes an opening/closing door 2a that can be opened and closed to the storage preparation chamber 30. The storage device 3 is set in each load port 2.

The storage device 3 can store a plurality of wafers 10 in a vertically stacked manner. The storage device 3 is configured as a FOUP, for example. FOUP is an abbreviation for Front Opening Unified Pod. The storage device 3 includes a lid that can be opened and closed, which is not shown.

The opening and closing of the lid of the storage device 3 is linked to the opening and closing of the opening/closing door 2a of the load port 2. When the lid of the storage device 3 and the opening/closing door 2a of the load port 2 are opened, the interior space of the storage device 3 and the interior space of the storage preparation chamber 30 are connected to each other. In this state, the in-vacuum twin-arm robot 1 can hold the wafer 10 and carry it in and out of the storage device 3. The opening and closing of the lid of the storage device 3 and the opening/closing door 2a of the load port 2 are controlled, for example, by the control unit 103.

In the processing unit 102, a space sealed against the external environment is formed. As in the storage unit 101, this space is filled with a small amount of the predetermined gas. Thus, the interior of the processing unit 102 is in a substantial vacuum.

The processing unit 102 includes the in-vacuum twin-arm robot 1 and a plurality of processing devices 4. In the following description, the in-vacuum twin-arm robot 1 included by the processing unit 102 may be referred to as process-side robot 1b.

The process-side robot 1b has the same configuration as the storage-side robot 1a. The process-side robot 1b is arranged in the approximate center of the processing preparation chamber 40 formed in the processing unit 102.

The processing device 4 performs at least one of the above process treatments on the wafer 10. This processing is performed in a vacuum.

Between the storage unit 101 and the processing unit 102, a plurality of PASS chambers 5 are provided. The PASS chamber 5 functions as a stage for passing the wafer 10. The number of PASS chambers 5 is two in this embodiment. However, this is not limited to this, and the number of PASS chambers 5 can be increased or decreased as necessary.

Each PASS chamber 5 includes a first door 51 and a second door 52. The first door 51 can open and close to the storage preparation chamber 30. When the first door 51 is opened, the PASS chamber 5 and the storage preparation chamber 30 are connected to each other. The second door 52 can open and close to the processing preparation chamber 40. When the second door 52 is opened, the PASS chamber 5 and the processing preparation chamber 40 are connected to each other. The opening and closing of the first door 51 and the second door 52 are controlled by the control unit 103.

With the storage preparation chamber 30 and the PASS chamber 5 spatially connected, the storage-side robot 1a can transport the wafers 10 between the PASS chamber 5 and the storage preparation chamber 30. With the processing preparation chamber 40 and the PASS chamber 5 spatially connected, the process-side robot 1b can transport the wafers 10 between the PASS chamber 5 and the processing preparation chamber 40.

The control unit 103 is configured as, for example, a known computer. This computer includes an arithmetic unit such as a CPU, and a memory unit including HDD, ROM, RAM, and the like. The memory unit stores, for example, programs for controlling the in-vacuum twin-arm robot 1 and various control information. The arithmetic unit controls the opening/closing movement of the opening/closing door 2a of the load port 2, the lid of the storage device 3, the first door 51 and the second door 52 of the PASS chamber 5, etc. by executing the program stored in the storage unit. Furthermore, the arithmetic unit of the control unit 103 controls the movements of the in-vacuum twin-arm robot 1. The control unit that controls the in-vacuum twin-arm robot 1 can be provided separately from the control unit 103.

The configuration of the in-vacuum twin-arm robot 1 is then described in detail with reference to FIG. 2 and FIG. 3. FIG. 2 is the diagonal view showing an example of the configuration of the in-vacuum twin-arm robot 1. FIG. 3 is the cross-sectional view illustrating the internal structure of the in-vacuum twin-arm robot 1.

As shown in FIG. 2, the in-vacuum twin-arm robot 1 includes mainly a base 11, a base arm 12, a first arm 13, a second arm 14, a first hand 15, and a second hand 16.

The base 11 serves as a base member to support a plurality of arms and hands included by the in-vacuum twin-arm robot 1. The base 11 is fixed, for example, to a wall or bottom plate comprising the storage preparation chamber 30

(processing preparation chamber 40). The base 11 is provided with an elevation shaft 17.

The elevation shaft 17 is provided to be elevated and lowered along its axis. The elevation shaft 17 is elevated and lowered, for example, by an elevation drive source (not shown) provided inside the base 11. The base arm 12 is connected to an upper end of the elevation shaft 17.

In the following description, when the base arm 12, the first arm 13, and the second arm 14 are extended in a straight line, an end of each arm on a side near the elevation shaft 17 is referred to as "base end" and an end of each arm on a side far from the elevation shaft 17 is referred to as "leading end".

The base arm 12 is configured as an elongated member that extends in a horizontal straight line. One end (base end) of the base arm 12 in the longitudinal direction is fixed to the upper end of the elevation shaft 17. The base arm 12 and the elevation shaft 17 are rotatably supported around an axis (vertical axis) of the elevation shaft 17. The first arm 13 and the second arm 14 are arranged at the other end (leading end) of the base arm 12 in the longitudinal direction.

The rotational movement of the base arm 12 is performed, for example, by a base arm drive unit 12a provided at the lower end of the elevation shaft 17. The base arm drive unit 12a includes, for example, an electric motor, a gear box, and the like. The power from the base arm drive unit 12a is transmitted to the base arm 12 via the elevation shaft 17.

The configuration in which the base arm 12 is elevatable and rotatable with respect to the base 11 is not limited to the above configuration. For example, the base arm 12 also can be rotatably supported relative to the elevation shaft 17, and the elevation shaft 17 may be configured to only elevate and lower with respect to the base 11.

In FIG. 1, the length of the base arm 12 of the process-side robot 1b and the length of the storage-side robot 1a are depicted as being equal. However, in reality, the base arm 12 of the process-side robot 1b is longer than the base arm 12 of the storage-side robot 1a. Thus, the access distance by the base arm 12, the first arm 13, and the second arm 14 realized by the process-side robot 1b can be longer than that of the storage-side robot 1a. FIG. 3 shows an example that the length L1 of the base arm 12 is longer than the length L2 of the first arm 13 and longer than the length L2 of the second arm 14 (L1>L2). The longer accessible distance allows the wafers 10 to be transported between locations farther away from each other without the need for a special configuration such as a mechanism to move the base 11 horizontally.

The left side of FIG. 1 shows an example where the number of load ports 2 arranged around the storage-side robot 1a is six. Four of the six load ports 2 are arranged in two pairs facing each other. The distance between the opposing load ports 2 in each pair is equal among the pairs.

The right side of FIG. 1 shows an example where the number of the processing devices 4 arranged around the process-side robot 1b is ten. Eight of the ten processing devices 4 are arranged in four pairs facing each other. The distance between the opposing processing devices 4 in each pair is equal among the pairs.

As shown in FIG. 1, in the plan view, the load ports 2 or the processing devices 4 are lined up to form three sides of a rectangle, and the robot 1 is arranged approximately in the center of the rectangle. This layout has the advantage of utilizing factory space more efficiently than a layout in which the load ports 2 or processing devices 4 are lined up to form a circle.

In particular, by the process-side robot 1b, the length L1 of the base arm 12 is longer than the length L2 of the first arm 13 and longer than the length L2 of the second arm 14. Thus, the access distance can be increased.

Therefore, the process-side robot 1b can appropriately handle the case where a relatively large number of source/destination location of transportation are arranged.

As shown in FIG. 3, the base arm 12 is formed into a hollow shape. The base arm 12 of this embodiment is formed so that its vertical dimension (thickness) is smaller than the first arm 13 and the second arm 14, which will be described later. In the inner wall of the base arm 12 is provided with a rigid metal (not shown). This increases the mechanical strength of the base arm 12.

This configuration allows the in-vacuum twin-arm robot 1 to be compactly formed in the height direction. Therefore, the semiconductor processing system 100 can be made compact overall. In addition, since the thickness of the base arm 12 is small, the reference height at which the first arm 13 and the second arm 14 are mounted (i.e., the height of the top surface of the base arm 12) can be lowered. As a result, the access height of the first hand 15 and the second hand 16 (described later) mounted respectively to the first arm 13 and the second arm 14 can be lowered.

The first arm 13 is configured as an elongated member that extends in a horizontal straight line. One end (the base end) of the first arm 13 in the longitudinal direction is mounted on the leading end of the base arm 12. The first arm 13 is supported to rotate around an axis (vertical axis) parallel to the elevation shaft 17. The first hand 15 is mounted to the other end (the leading end) of the first arm 13 in the longitudinal direction.

As shown in FIG. 3, the first arm 13 has a predetermined thickness and is formed into a hollow shape. A first arm gear box 13a is provided inside the first arm 13. An electric motor and reduction gear, which are not shown, are installed inside the first arm gear box 13a. The first arm gear box 13a can rotate the first arm 13 with respect to the base arm 12 by the driving force of the electric motor.

A first hand gear box 15a is provided inside the first arm 13. An electric motor and reduction gear, which are not shown, are installed inside the first hand gear box 15a. The first hand gear box 15a can rotate the first hand 15 with respect to the first arm 13 by a driving force of the electric motor.

Like the first arm 13, the second arm 14 is configured as an elongated member that extends in a horizontal straight line. The second arm 14 is provided above the first arm 13. One end (the base end) of the second arm 14 in the longitudinal direction is mounted on the base end of the first arm 13 (the leading end of the base arm 12). The second arm 14 is supported to rotate around an axis (vertical axis) parallel to the elevation shaft 17. The second hand 16 is mounted on the other end (the leading end) of the second arm 14 in the longitudinal direction.

As shown in FIG. 3, the second arm 14 has a predetermined thickness and is formed into a hollow shape. A second arm gear box 14a is provided inside the second arm 14. The configuration of the second arm gear box 14a is the same as that of the first arm gear box 13a. The second arm gear box 14a can rotate the second arm 14 with respect to the base arm 12 by a driving force of an electric motor.

A second hand gear box 16a is provided inside the second arm 14. The configuration of the second hand gear box 16a is the same as that of the first hand gear box 15a. The second hand gear box 16a can rotate the second hand 16 with respect to the second arm 14 by a driving force of an electric motor.

As shown in FIG. 2 and FIG. 3, the first arm 13 and the second arm 14 are connected to the base arm 12 via an elbow shaft (joint shaft) 18. The elbow shaft 18 is parallel to the elevation shaft 17. The elbow shaft 18 is formed in a hollow cylindrical shape.

As shown in FIG. 3, magnetic fluid seals 6 are provided at predetermined locations on an outer circumference of the elbow shaft 18. These predetermined locations are, for example, the connection points between the elbow shaft 18 and each of the base arm 12, the first arm 13, and the second arm 14 respectively. This allows the interior space of the in-vacuum twin-arm robot 1 to be sealed. Thus, air inside the in-vacuum twin-arm robot 1 can be prevented from leaking to the outside (storage preparation chamber 30 or processing preparation chamber 40).

As shown in FIG. 3, a first gear 13b and a second gear 14b as transmission members are mounted on the outer circumference of the elbow shaft 18. The first gear 13b is used to transmit a driving force from the electric motor (not shown) included by the first arm gear box 13a to the first arm 13. The second gear 14b is used to transmit a driving force from the electric motor (not shown) included by the second arm gear box 14a to the second arm 14. In other words, the first gear 13b and the second gear 14b constitute a drive transmission mechanism that transmits the driving force from the electric motor to the first arm 13 and the second arm 14. The drive transmission mechanism is not limited to the use of gears, but can also be, for example, a belt. In this case, a pulley as a transmission member is mounted on the outer circumference of the elbow shaft 18.

Specifically, the first gear 13b is fixed to the outer circumference of the elbow shaft 18. The first gear 13b meshes with the output gear (not shown) provided by the first arm gear box 13a. Since the first arm gear box 13a is fixed to the first arm 13, the first arm 13 rotates with respect to the first gear 13b (elbow shaft 18) by the driving of the motor in the first arm gear box 13a.

The second gear 14b is fixed to the outer circumference of the elbow shaft 18. The second gear 14b meshes with the output gear (not shown) provided by the second arm gear box 14a. Since the second arm gear box 14a is fixed to the second arm 14, the second arm 14 rotates with respect to the second gear 14b (elbow shaft 18) by the driving of the motor in the second arm gear box 14a.

As shown in FIG. 2 etc., the first hand 15 is formed in a shape branched into two branches. The wafer 10 can be held at each of tip ends of the branches the first hand 15. Thus, the first hand 15 can hold two wafers 10 at the same time. The first hand 15 can simultaneously transfer the wafers 10 to each of the two storage devices 3 adjacent to each other or each of the two PASS chambers 5 adjacent to each other.

The first hand 15 can hold and can release the holding of the wafer 10. The wafer 10 can be held by the first hand 15 in various ways, such as by placing the wafer 10 on the first hand 15 or by clamping the wafer 10 by the first hand 15.

The second hand 16 is also configured in the same way as the first hand 15 and can hold two wafers 10 at the same time.

The first hand 15 is rotatably mounted on the leading end of the first arm 13. The first hand 15 is arranged above the first arm 13 and adjacent to the first arm 13.

A gear (not shown) is fixed to the first hand 15. This gear meshes with an output gear (not shown) provided by the first hand gear box 15a. Since the first hand gear box 15a is fixed to the first arm 13, the first hand 15 rotates with respect to the first arm 13 by the driving of the motor in the first hand gear box 15a.

The second hand 16 is rotatably mounted on the leading end of the second arm 14. The second hand 16 is arranged below the second arm 14 and adjacent to the second arm 14.

The second hand 16 rotates with respect to the second arm 14 by the driving of the second hand gear box 16a. Since this configuration is substantially the same as the configuration in which the first hand 15 is driven by the first hand gear box 15a, the explanation is omitted.

As described above, in this embodiment of the in-vacuum twin-arm robot 1, the second arm 14, the second hand 16, the first hand 15, and the first arm 13 are arranged in order from top to bottom. This configuration allows the first hand 15 and the second hand 16 to be arranged close to each other in the height direction. Therefore, for example, when two wafers 10, which are located adjacent to each other in the vertical direction, are respectively taken out while switching the two hands and transported, the elevating distance of the elevation shaft 17 can be extremely shortened. Therefore, the operating efficiency of the in-vacuum twin-arm robot 1 can be improved.

In this embodiment of the in-vacuum twin-arm robot 1, electric motors for driving the elevation shaft 17, the base arm 12, the first arm 13, the second arm 14, the first hand 15, and the second hand 16 are provided respectively. The drive of each electric motor is independently controlled by the control unit 103. That is, the elevation shaft 17, the base arm 12, the first arm 13, the second arm 14, the first hand 15, and the second hand 16 are driven independently by controlling of the control unit 103.

This allows for greater freedom of movement of the first hand 15 and the second hand 16. For example, the in-vacuum twin-arm robot 1 can be flexibly adapted to either the six-chamber layout shown on the left side of FIG. 1 or the ten-chamber layout shown on the right side.

In the processing unit 102 shown on the right side of FIG. 1, in the plan view, ten processing devices 4 are arranged in four, two, and four to form three sides of an elongated rectangle. The processing device 4 located in the corner of the rectangle is relatively far from the base 11.

In this process-side robot 1b, which is located in the processing unit 102, the length L1 of the base arm 12 is longer than the length L2 of the first arm 13 and longer than the length L2 of the second arm 14. In the process-side robot 1b, the base arm 12, the first arm 13, the second arm 14, the first hand 15, and the second hand 16 are driven independently of each other.

By the above configuration, even in the ten-chamber layout as described above and without a mechanism such as a moving shaft for moving the base 11 of the process-side robot 1b, the only one process-side robot 1b can move and transfer the wafer 10 to each processing device 4. As a result, the equipment cost for the process-side robot 1b can be greatly reduced. In addition, the process-side robot 1b can swap the wafers 10 as workpieces without performing the swapping operation described later. Therefore, the wafers 10 can be swapped at high speed, and the throughput of processing can be improved.

Each of the first hand 15 and the second hand 16 is equipped with electrical components not shown, such as mapping sensors, cameras, etc. The in-vacuum twin-arm robot 1 includes a wiring harness 9 to provide electrical connections to these components. The wiring harness 9 includes power cables that supply power to the electrical components, signal cables that transmit input or output signals, and the like.

As shown in FIG. 3, this wiring harness 9 passes through the inside of the elevation shaft 17, the base arm 12, the elbow shaft 18, and the first arm 13 or the second arm 14 to the first hand 15 or the second hand 16.

In the in-vacuum twin-arm robot 1, air flows in the internal space through which the wiring harness 9 passes. For example, when the processing device 4 performs processing at high temperatures, the process-side robot 1b, which transports the wafers 10, may also become hot. However, by circulating air inside the in-vacuum twin-arm robot 1, the temperature of the in-vacuum twin-arm robot 1 can be prevented from becoming excessively high. As a result, the wiring harness 9, which is relatively easily affected by heat, can be passed through the interior space of the in-vacuum twin-arm robot 1.

Here, the layout for driving the first arm 13 and the second arm 14 independently will be described.

If the first arm gear box 13a and the second arm gear box 14a are arranged in the base arm 12, a drive transmission path (typically, a transmission shaft) to transmit the output of each gear box to the first arm 13 and the second arm 14 would need to be arranged in the elbow shaft 18. Moreover, in order to drive each of the two arms independently, the transmission shaft needs to be, for example, doubly structured.

In this regard, in the in-vacuum twin-arm robot 1, the first arm gear box 13a and the second arm gear box 14a are provided inside the first arm 13 and the second arm 14. Therefore, the transmission of power to drive the first arm 13 and the second arm 14 is completed only by each gear box meshing with the first gear 13b and the second gear 14b fixed on the outer periphery of the elbow shaft 18. Therefore, in this embodiment, there is no need to place a transmission shaft inside the elbow shaft 18.

This allows for a larger internal space in the elbow shaft 18. This space margin allows the wiring harness 9 to be placed in the elbow shaft 18 with some slack. This slack allows the wiring harness 9 to easily absorb the twisting when the first arm 13 and the second arm 14 rotate. As a result, the durability of the wiring harness 9 can be improved.

Next, the movement when the storage-side robot 1a accesses the PASS chamber 5 will be briefly described with reference to FIGS. 4 to 7. FIGS. 4 to 7 are plan views of the movement of the in-vacuum twin-arm robot 1.

In the plan view of FIG. 4, the first hand 15 is not shown because it is directly below the second hand 16 and overlaps exactly.

Figure 4:
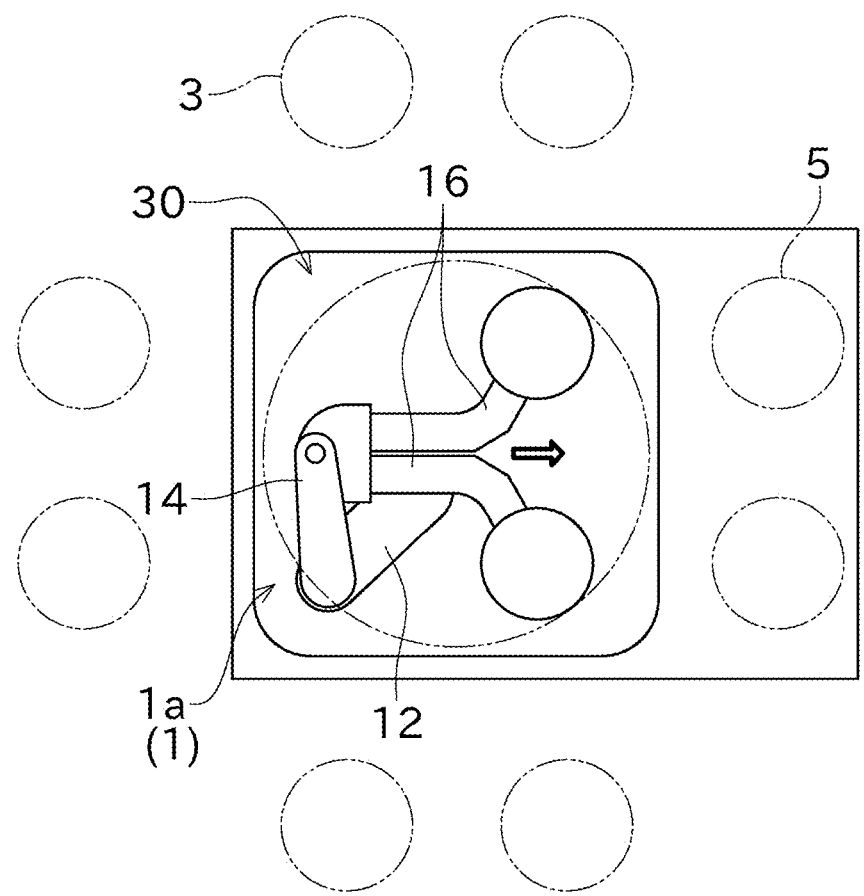
FIG. 4 is a plan view showing a movement of the in-vacuum twin-arm robot.

FIG. 4 shows the state of the second hand 16 just before it begins to move into the PASS chamber 5. As shown in FIG. 4, the second hand 16 is positioned so that it is facing straight into the PASS chamber 5.

In FIG. 4, the first hand 15 is in the same posture as the second hand 16, and the first arm 13 is in the same posture as the second arm 14. Thus, although the first arm 13 and the first hand 15 do not appear in FIG. 4, they are located directly below the second arm 14 and the second hand 16.

Consider the case where the second hand 16 is moved in a straight line to advance into the PASS chamber 5 from the state shown in FIG. 4. In this case, as shown in FIGS. 5 to 7, the control unit 103 causes the first arm 13 and the first hand 15 to rotate following the rotation of the base arm 12, the second arm 14 and the second hand 16 for realizing such a movement.

Specifically, the base arm 12 rotates clockwise as appropriate in FIG. 4. The second arm 14 rotates accordingly in conjunction with the rotation of the base arm 12 so that the leading end of the second arm 14 approaches the PASS chamber 5 side in a linear trajectory. The second hand 16 rotates appropriately so that the second hand 16 maintains a straight orientation toward the PASS chamber 5 even if the orientation of the second arm 14 changes. The above allows the second hand 16 to move in a straight line while maintaining the orientation of the second hand 16. When the leading end of the second hand 16 reaches the PASS chamber 5, the advancing movement is complete.

During the advancing process of the second hand 16 described above, the position of the leading end of the base arm 12 changes in an arc. As shown in FIGS. 5 to 7, the first arm 13 and the first hand 15, which do not perform the advancing movement, rotate correspondingly with the rotation of the base arm 12.

Figure 5:
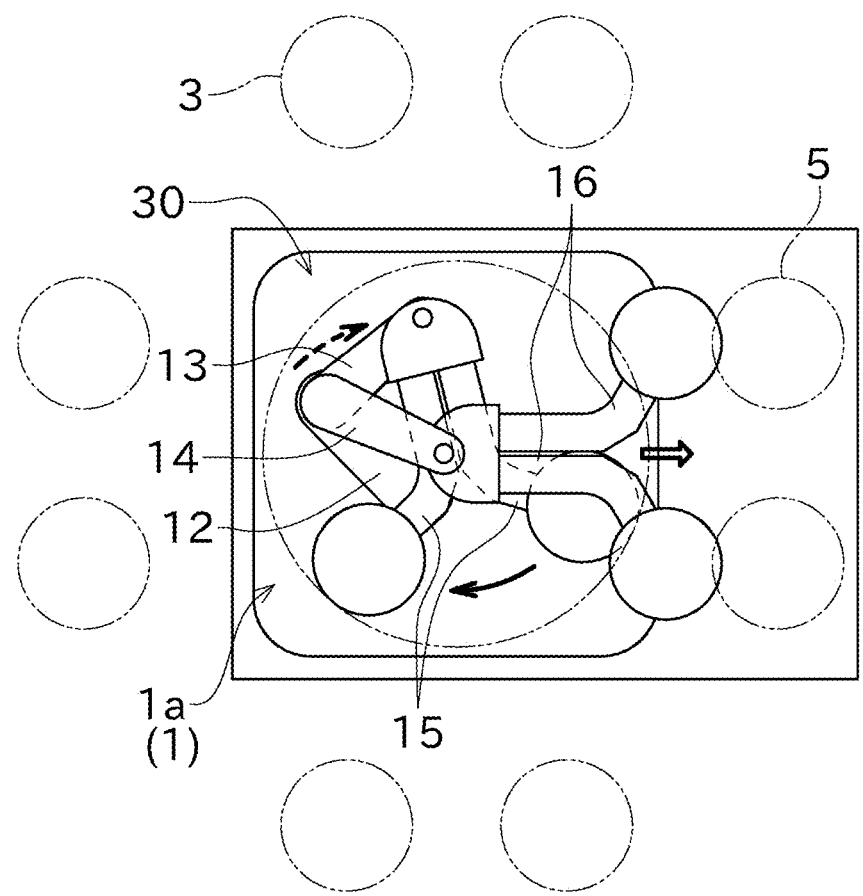
FIG. 5 is a plan view showing a movement of the in-vacuum twin-arm robot.
Figure 6:
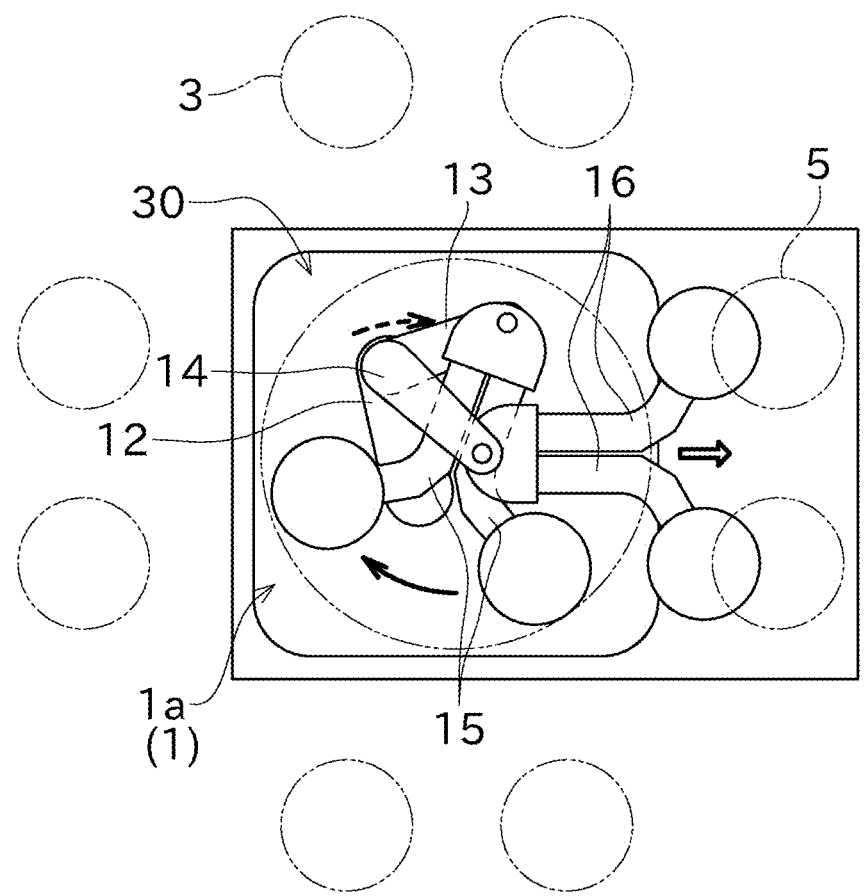
FIG. 6 is a plan view showing a movement of the in-vacuum twin-arm robot.
Figure 7:
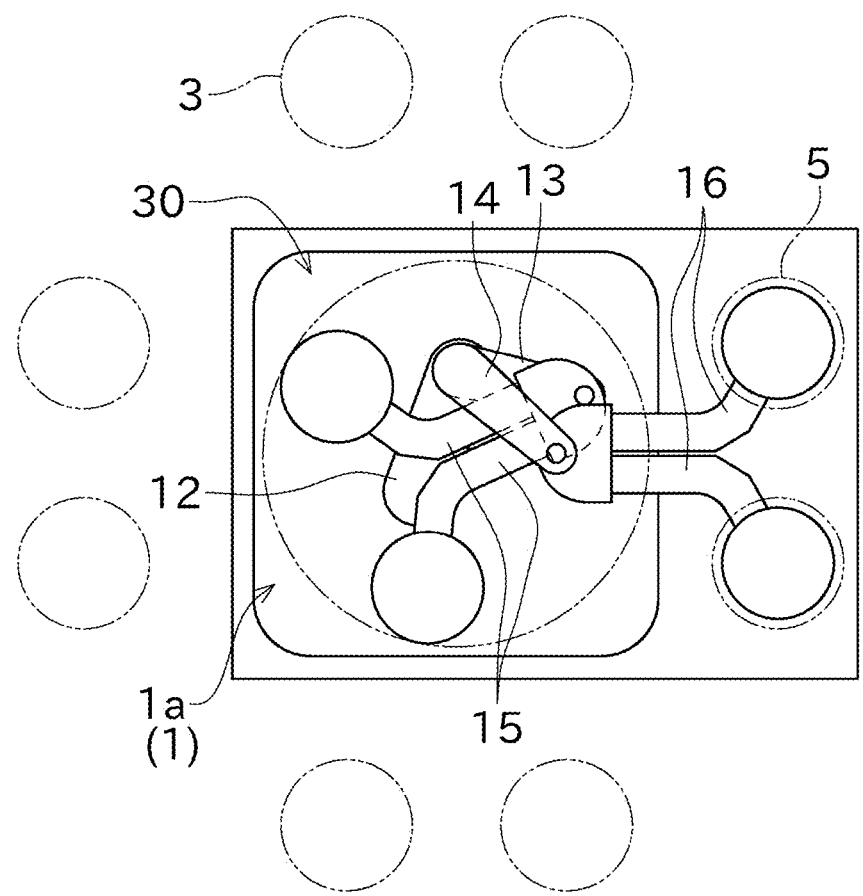
FIG. 7 is a plan view showing a movement of the in-vacuum twin-arm robot.

As shown in FIGS. 5 to 7, as the base arm 12 rotates, the angle between the base arm 12 and the first arm 13 changes so that the angle gradually increases. As the base arm 12 rotates, the angle between the first arm 13 and the first hand 15 changes so that the angle gradually decreases.

This movement allows the first arm 13 and the first hand 15 to be folded compactly, and their moving range can be kept within the range of the chain line circle shown in FIGS. 4 to 7. This allows the in-vacuum twin-arm robot 1 to be set up even in the storage preparation chamber 30, which is a relatively small space, and be capable of accessing the storage devices 3 and the PASS chamber 5.

The folded state means, for example, that the angle between the first arm 13 and the first hand 15 is 90° or less. However, it is not limited to this.

During the operation from FIG. 4 to FIG. 7, the first hand 15 is bent at a large angle relative to the first arm 13. Thus, at least a portion of the first hand 15 is, in the plan view (in other words, when viewed along the axis of the elbow shaft 18), overlapping the base arm 12.

As described above, the control unit 103 independently drives each of the base arm 12, the first arm 13, the second arm 14, the first hand 15, and the second hand 16. This allows the complex movement described above to be achieved.

FIG. 7 shows that the second hand 16 has completed its advancing movement and is ready to perform the transferring to the PASS chamber 5. After transferring the wafer 10, the second hand 16 performs a retreat movement. In this retreat movement, the base arm 12, the first arm 13, the second arm 14, the first hand 15, and the second hand 16 move in exactly the opposite way as in the above-mentioned advancing movement. The above allows the system to return to the state shown in FIG. 4.

The above is an example of moving the second hand 16 into and out of the PASS chamber 5, instead of the second hand 16, the first hand 15 can move into and out of the PASS chamber 5 from the state shown in FIG. 4. In this case, the operation of the first hand 15 and the second hand 16 in the above description are interchanged.

In summary, the state shown in FIG. 4 is a state in which the first hand 15 can advance/retract relative to the PASS chamber 5, while the second hand 16 can advance/retract relative to the PASS chamber 5. Therefore, it can be said that the state shown in FIG. 4 is a base state common to both the first hand 15 and the second hand 16.

Any of the first hand 15 and the second hand 16 can be advanced into the PASS chamber 5 from the state shown in FIG. 4. The control unit 103 controls each part so that when one of the first hand 15 and the second hand 16 is advanced, the other hand is rotated in a folded state (non-advanced state). The control unit 103 controls each part so that when one of the hands that is advancing retracts for returning to the original state (FIG. 4), the other hand in the folded state rotates in the opposite direction for returning to the original state (FIG. 4).

Thus, the storage-side robot 1a can access the PASS chamber 5 by the first hand 15 and the second hand 16 sequentially without requiring a special operation such as switching the accessing hand (swapping operation). Therefore, the access movement by each hand can be performed continuously, and the operating efficiency of the in-vacuum twin-arm robot 1 can be improved.

When the storage-side robot 1a accesses the storage preparation chamber 30 (storage device 3) located above, left, or below in FIG. 4, it also can operate in substantially the same manner as when accessing the PASS chamber 5 described above.

As described above, in this embodiment of the in-vacuum twin-arm robot 1, a transmission shaft to the first arm 13 and the second arm 14 is not provided in the elbow shaft 18. Therefore, the elbow shaft 18 can be formed thin. Thus, this can prevent interference between the elbow shaft 18 and the first hand 15, even when the first hand 15 is bent strongly against the first arm 13, as shown in FIG. 7, for example. Similarly, interference between the elbow shaft 18 and the second hand 16 can be prevented, even when the second hand 16 is bent strongly against the second arm 14. Therefore, the range of movement can be made compact.

As described above, the in-vacuum twin-arm robot 1 of this embodiment is used to transport the wafers 10 in the sealed vacuum space (storage preparation chamber 30 or processing preparation chamber 40). The in-vacuum twin-arm robot 1 includes the base arm 12, the first arm 13, the second arm 14, the first hand 15, and the second hand 16. The base arm 12 can move vertically and can rotate. The first arm 13 can rotate with respect to the base arm 12. The second arm 14 can rotate with respect to the base arm 12. The first hand 15 can rotate with respect to the first arm 13, and the first hand 15 holds and transports the wafer 10. The second hand 16 can rotate with respect to the second arm 14, and the second hand 16 holds and transports the wafer 10. The first arm 13 and the second arm 14 are rotatably mounted on the leading end of the base arm 12 via the elbow shaft 18 formed hollow. The angle of the first hand 15 with respect to the first arm 13 and the angle of the second hand 16 with respect to the second arm 14 can be changed independently of each other.

This allows for efficient use of the internal space of the elbow shaft 18. Therefore, it can realize miniaturization of the in-vacuum twin-arm robot 1. In addition, by the independent drive of the first hand 15 and the second hand 16, it can realize a variety of movements of the in-vacuum twin-arm robot 1.

At the in-vacuum twin-arm robot 1, the length L1 of the base arm 12 is longer than the length L2 of the first arm 13 and longer than the length L2 of the second arm 14.

Thus, this allows a greater access distance for the in-vacuum twin-arm robot 1.

At the in-vacuum twin-arm robot 1, the base arm 12, the first arm 13, the second arm 14, the first hand 15, and the second hand 16 are each driven independently.

Thus, this allows complex operations to be realized by independent driving of each part, thereby reducing operation time, etc.

At the in-vacuum twin-arm robot 1, the outer circumference of the elbow shaft 18 is provided with the first gear 13b and the second gear 14b. The first gear 13b and the second gear 14b constitute the drive transmission mechanism that transmits the driving force to drive the first arm 13 and the second arm 14.

Thus, it is not necessary to arrange the transmission shafts of the first arm 13 and the second arm 14 inside the elbow shaft 18, ensuring a larger interior space of the elbow shaft 18.

At the in-vacuum twin-arm robot 1, the harness 9 to the first hand 15 and the second hand 16 pass through the inside of the elbow shaft 18.

Thus, for example, when the first hand 15 and the second hand 16 are equipped with electrical components such as sensors, it is possible to easily secure the installation space of the harness 9 connected to these electrical components.

At the in-vacuum twin-arm robot 1, the base arm 12, the first arm 13, and the second arm 14 are formed hollow. The interior space of each of the base arm 12, the first arm 13, and the second arm 14 is sealed against the storage preparation chamber 30 or processing preparation chamber 40. Air flows through the interior space.

Thus, the in-vacuum twin-arm robot 1 can be cooled by the flowing air.

At the in-vacuum twin-arm robot 1, the first arm gear box that drives the first arm 13 and the first hand gear box that drives the first hand 15 are located inside the first arm 13. The second arm gear box that drives the second arm 14 and the second hand gear box that drives the second hand 16 are located inside the second arm 14.

Thus, it is not necessary to arrange the gear box in the base arm 12. Therefore, the base arm 12 can be formed thinner and the minimum access height of each hand can be lowered.

The in-vacuum twin-arm robot 1 includes the control unit 103. The control unit 103 controls movements of each of the base arm 12, the first arm 13, the second arm 14, the first hand 15, and the second hand 16. The control unit 103 controls, from the state of FIG. 4, to advance one of the first hand 15 and the second hand 16 (for example, the second hand 16) to the PASS chamber 5 and, in conjunction with its advancing, to rotate the other arm and hand (for example, the first arm 13 and the first hand 15 in FIG. 7) in a folded state. In the state of FIG. 4, the first arm 13 and the second arm 14 are in the same posture and the first hand 15 and the second hand 16 are in the same posture.

Thus, when one of the first hand 15 and the second hand 16 is extended, the other arm and hand are rotated without being straightened, which makes the in-vacuum twin-arm robot 1 can operate in the narrow storage preparation chamber 30 or the narrow processing preparation chamber 40.

At the in-vacuum twin-arm robot 1, the control unit 103 controls one of the first hand 15 and the second hand 16 (for example, the second hand 16 in FIG. 7), that is advancing to the PASS chamber 5, to retract for returning to the state in FIG. 4 and, in conjunction with its retracting, to rotate the other arm and hand (for example, the first arm 13 and the first hand 15 in FIG. 7) in a folded state for returning to the state in FIG. 4.

Thus, the first hand 15 and the second hand 16 can continuously access operations without the swapping operation of the hand. Therefore, the operation efficiency of the in-vacuum twin-arm robot 1 can be improved.

Although the preferred embodiment of the present invention has been described above, the configurations described above may be modified as follows, for example.

The control unit that controls the various parts of the in-vacuum twin-arm robot 1 can also be located inside the base 11.

The first hand 15 may be provided adjacent to the lower side of the first arm 13. The second hand 16 may be provided adjacent to the upper side of the second arm 14.

When any one of the first hand 15 and the second hand 16 is advanced/retracted in a straight line, the other hand and arm can maintain their posture and rotate in conjunction with the rotation of the base arm 12.

The layout of the load ports 2 around the storage-side robot 1a and the layout of the processing devices 4 around the process-side robot 1b are not limited to those shown in FIG. 1. For example, ten load ports 2 may be arranged around the storage-side robot 1a in substantially the same arrangement as the processing devices 4.

The present invention can also be applied to a robot for transporting substrates other than the wafers 10 (for example, glass plates).

DESCRIPTION OF THE REFERENCE NUMERALS 1 in-vacuum twin-arm robot
12 base arm
13 first arm
14 second arm
15 first hand
16 second hand
18 elbow shaft (joint shaft)
30 storage preparation chamber (vacuum space)
40 processing preparation chamber (vacuum space)

The invention claimed is:

1. An in-vacuum twin-arm robot for transporting substrates in a sealed vacuum space, comprising:
a base arm that can move vertically and can rotate;
a first arm that can rotate with respect to the base arm;
a second arm that can rotate with respect to the base arm;
a first hand that can rotate with respect to the first arm, for holding and transferring a substrate; and
a second hand that can rotate with respect to the second arm, for holding and transferring a substrate, wherein
the first arm and the second arm are rotatably mounted on a leading end of the base arm via a joint shaft that is hollow,
an angle of the first hand with respect to the first arm and an angle of the second hand with respect to the second arm can be changed independently of each other,
a first arm gear box that drives the first arm that is located inside the first arm, and
a second arm gear box that drives the second arm that is located inside the second arm,
a first gear and a second gear are mounted on an outer circumference of the joint shaft, and the first gear transmits driving force from the first arm gear box and the second gear transmits driving force from the second arm gear box.

2. An in-vacuum twin-arm robot for transporting substrates in a sealed vacuum space, comprising:
a base arm that can move vertically and can rotate;
a first arm that can rotate with respect to the base arm;
a second arm that can rotate with respect to the base arm;
a first hand that can rotate with respect to the first arm, for holding and transferring a substrate; and
a second hand that can rotate with respect to the second arm, for holding and transferring a substrate, wherein
the first arm and the second arm are rotatably mounted on a leading end of the base arm via a joint shaft that is hollow, and
a length of the base arm is longer than a length of the first arm and longer than a length of the second arm,
a first arm gear box that drives the first arm that is located inside the first arm, and
a second arm gear box that drives the second arm that is located inside the second arm,
a first gear and a second gear are mounted on an outer circumference of the joint shaft, and the first gear transmits driving force from the first arm gear box and the second gear transmits driving force from the second arm gear box.

3. The in-vacuum twin-arm robot according to claim 1, wherein
the base arm, the first arm, the second arm, the first hand, and the second hand are each driven independently.

4. The in-vacuum twin-arm robot according to claim 1, wherein
a harness to the first hand and the second hand pass through an inside of the joint shaft.

5. The in-vacuum twin-arm robot according to claim 1, wherein
the base arm, the first arm, and the second arm are hollow, an interior space of each of the base arm, the first arm, and the second arm is sealed against the vacuum space, and air flows through the interior space.

6. The in-vacuum twin-arm robot according to claim 1, wherein
a first hand gear box that drives the first hand is located inside the first arm, and
a second hand gear box that drives the second hand is located inside the second arm.

7. The in-vacuum twin-arm robot according to claim 1, comprising:
a robot controller that controls movements of each of the base arm, the first arm, the second arm, the first hand, and the second hand, wherein
the robot controller controls, from a base state in which the first arm and the second arm are in a same posture and the first hand and the second hand are in a same posture, to advance one of the first hand and the second hand and, in conjunction with its advancing, to rotate the other arm and hand in a folded state.

8. The in-vacuum twin-arm robot according to claim 7, wherein
the robot controller controls to retract one of the first hand and the second hand, that is advancing, for returning to the base state and, in conjunction with its retracting, to rotate the other arm and hand in a folded state for returning to the base state.

* * * * *